United States Patent
Flourens et al.

(10) Patent No.: US 10,365,311 B2
(45) Date of Patent: Jul. 30, 2019

(54) ON-BOARD SYSTEM FOR EVALUATING THE SEVERITY OF A LIGHTNING STRIKE

(71) Applicant: Airbus Operations SAS, Toulouse (FR)

(72) Inventors: Franck Flourens, Toulouse (FR); Frederic Labal, Rouffiac-Tolosan (FR); Jean-Francois Boissin, Toulouse (FR)

(73) Assignee: Airbus Operations SAS, Toulouse (FR)

( * ) Notice: Subject to any disclaimer, the term of this patent is extended or adjusted under 35 U.S.C. 154(b) by 140 days.

(21) Appl. No.: 15/597,233

(22) Filed: May 17, 2017

(65) Prior Publication Data

US 2017/0336453 A1 Nov. 23, 2017

(30) Foreign Application Priority Data

May 20, 2016 (FR) ..................................... 16 54549

(51) Int. Cl.
| | |
|---|---|
| *G01R 29/08* | (2006.01) |
| *B64D 45/02* | (2006.01) |
| *H02G 13/00* | (2006.01) |
| *G01R 31/00* | (2006.01) |
| *B64D 45/00* | (2006.01) |

(52) U.S. Cl.
CPC ......... *G01R 29/0842* (2013.01); *B64D 45/02* (2013.01); *G01R 31/008* (2013.01); *H02G 13/60* (2013.01); *B64D 2045/0085* (2013.01)

(58) Field of Classification Search
CPC .. G01R 29/0842; G01R 31/008; B64D 45/02; B64D 2045/0085; H02G 13/60
See application file for complete search history.

(56) References Cited

U.S. PATENT DOCUMENTS

| | | | | |
|---|---|---|---|---|
| 4,672,305 | A * | 6/1987 | Coleman | G01W 1/16 324/72 |
| 7,714,743 | B1 * | 5/2010 | Woodell | B64D 45/02 324/72 |
| 8,264,215 | B1 | 9/2012 | Kovach et al. | |
| 9,567,104 | B2 * | 2/2017 | Sweers | G01M 5/0016 |
| 2002/0163446 | A1 * | 11/2002 | Schwinn | G06F 3/0481 340/945 |
| 2015/0293264 | A1 * | 10/2015 | Honma | G01R 33/02 324/225 |
| 2016/0041205 | A1 * | 2/2016 | Aoi | G01R 29/0842 324/72 |

OTHER PUBLICATIONS

French Search Report, dated Jan. 19, 2017, priority document.
(Continued)

*Primary Examiner* — Jeff W Natalini
(74) *Attorney, Agent, or Firm* — Greer, Burns & Crain, Ltd.

(57) ABSTRACT

An on-board system for evaluating the severity of a lightning strike, intended to be installed in the interior of an airplane and connected to an avionic system of the airplane. The system comprises four devices, a master device and three slave devices, each device comprising a magnetic-field sensor. The devices are placed pairwise symmetrically about a plane of symmetry of the airplane, vertically in line with the leading edge of the wing of the airplane and vertically in line with the trailing edge of the wing, respectively. The system allows an evaluation of the severity of a lightning strike to be obtained depending on the measured magnetic fields.

9 Claims, 5 Drawing Sheets

(56) References Cited

OTHER PUBLICATIONS

"Developing an in-flight strike damage assessment system", Alestra, et al., Aug. 28, 2007.
"In flight lightning damage assessment system (ILDAS): Initial in-flight lightning tests and improvement of the numerica mehotds", de Boer et al., Sep. 6, 2011.
"Final Publishable information—adapted from final report: In Flight Lightning damage assessment System (ILDAS) result of the concept prototypes tests. Project No. 030806" Zwemmer et al., Sep. 15, 2009.

* cited by examiner

ON-BOARD SYSTEM FOR EVALUATING THE SEVERITY OF A LIGHTNING STRIKE

CROSS-REFERENCES TO RELATED APPLICATIONS

This application claims the benefit of the French patent application No. 16 54549 filed on May 20, 2016, the entire disclosures of which are incorporated herein by way of reference.

BACKGROUND OF THE INVENTION

The present invention relates to the field of a system and method for evaluating the severity of a lightning strike undergone by an aircraft, and more particularly by an airplane.

The ILDAS 1 (In-flight Lightning Damage Assessment System) project, conducted between 2006 and 2009, was a project supported by the European Union in order to validate the principle of an on-board system for measuring bolts of lightning and evaluating the severity of a lightning strike undergone by an airplane, and, in particular, in order to evaluate any damage caused by the lightning on the airplane. The long-term aim of this project was to improve scientific knowledge, but also to facilitate the airplane maintenance operations following one or more bolts of lightning. A test campaign was carried out on an Airbus A320 in 2009. The results of this project were, in particular, presented at the 23rd symposium of the SFTE-EC (Society of Flight Test Engineers European Chapter) held on the 11 to 13 Jun. 2012 in Amsterdam, the Netherlands. In the context of the ILDAS 1 project, the Eindhoven University of Technology (the Netherlands) developed a magnetic-field sensor technology that was installable on a porthole of an airplane cabin. The principle of such a sensor is that the current injected into the fuselage of an airplane struck by a bolt of lightning generates a magnetic field outside and around the airplane. One means of measuring this magnetic field is to measure the penetration of this field through an aperture in the fuselage such as a porthole. A single antenna installed through a porthole, in the interior of the airplane, allows this to be achieved.

With regard to the promising results, Airbus decided to continue this project and the project ILDAS 2 started in 2009. The objective of the ILDAS 2 project was, inter alia, to obtain a commercializable on-board system for evaluating the severity of a lightning strike undergone by an airplane and, in particular, the damage caused by the lightning strike to the airplane. The results of this project ILDAS 2 were presented during an international conference held at Toulouse (France) on 9 to 11 Sep. 2015 (International Conference on Lighting & Static Electricity—ICOLSE). The architecture of the system developed and tested on an Airbus A350 XWB is presented in FIG. 1. The system developed in the context of the ILDAS 2 project comprises, placed in the interior of an airplane 100, an electric-field-sensing device E (101), eight magnetic-field-sensing devices H (130 to 137), two current-sensing devices I (110 and 111) and two x-ray-sensing devices (120 and 121). The system furthermore comprises a plurality of control units, for recording and processing the signals generated by the various sensors (Data Accumulation and Data Storage—DADS—units).

However, the system developed in the context of the ILDAS 2 project remains a prototype that is not commercially viable because of its installation and maintenance complexity, and therefore its cost. The proposed system furthermore allows only an a posteriori analysis of the data gathered by the sensors and therefore requires the intervention of technicians after each flight to be exploited.

A simplification of the system developed in the ILDAS 2 project was envisioned, retaining only two single magnetic-field sensors placed on the same side of the fuselage of an airplane, at the front and at the back of the fuselage. However, although initial results were encouraging, this simplified system did not work for bolts of lightning having a point of entrance on the fuselage and a point of exit on a wing of the airplane. In other words, only certain scenarios vis-à-vis the point of entrance and point of exit of the lightning on an airplane were covered by such a simplified system.

There is therefore a need to provide a system mitigating the drawbacks of the previously developed systems.

SUMMARY OF THE INVENTION

The invention relates to an on-board system for evaluating the severity of a lightning strike undergone by an airplane, intended to be installed in the interior of the airplane, the system comprising at least one device that is called a slave device, each slave device comprising a magnetic-field sensor placed on a porthole of the airplane, and being suitable for continuously recording a magnetic field measured by the magnetic-field sensor, for detecting, depending on the measured magnetic field, a moment corresponding to a lightning strike, for selecting a portion of the continuous recording, depending on the detected moment, for transmitting the selected portion of the continuous recording to what is called a master device, and, the master device being suitable for receiving from each slave device a portion of a continuous recording of a measured magnetic field, identifying a scenario vis-à-vis the bolt of lightning received by the airplane depending on the one or more received recording portions, finding a predetermined transfer function associated with the identified scenario for each slave device, each transfer function allowing a current injected into the airplane by the bolt of lightning to be determined from a measured magnetic field, determining, from the received recordings and the injected current, an evaluation of the severity of the lightning strike undergone by the aircraft.

Advantageously, the on-board system for evaluating the severity of a lightning strike undergone by an airplane is installed in the interior of the airplane, thereby facilitating maintenance. Since the slave devices are suitable for detecting and selecting a portion of a continuous recording, this avoids having to continuously transmit data between a slave device and a master device, thereby decreasing the amount of data exchanges and allowing the specifications of the network between these elements to be lowered. Likewise, basing the actions performed on predetermined scenarios makes it possible to decrease the need for processing of the recorded data by the master device, and therefore to reduce costs, as lower performance components may be selected.

According to one complementary embodiment of the invention, the master device comprises a magnetic-field sensor placed on a porthole of the airplane and is suitable for integrating the functionalities of a slave device.

Advantageously, the master device is integrated with a slave device, this decreasing the number of elements of the system and facilitating its implementation in an airplane.

According to one complementary embodiment of the invention, the system being located on board an airplane having a plane of symmetry, the system comprises one master device and three slave devices, the devices being placed pairwise symmetrically with respect to the plane of symmetry, the magnetic-field sensors of one pair of devices being installed on portholes in front of the wings of the airplane and the magnetic-field sensors of the other pair of devices being installed on portholes behind the wings of the airplane.

Advantageously, this arrangement of four devices is a compromise between a system allowing a good detection of various scenarios vis-à-vis lightning strikes reaching the airplane and a decrease in costs. A system comprising more devices is more expensive and a system comprising fewer devices becomes too inaccurate.

According to one complementary embodiment of the invention, the airplane having wings, the sensors of the four devices are installed on a pair of portholes located vertically in line with the leading-edge of the wings and on a pair of portholes located vertically in line with the trailing edge of the wings, the portholes of each pair of portholes being placed symmetrically with respect to the plane of symmetry.

Advantageously, this location of the devices is optimal and allows the best rate of recognition of the various scenarios.

According to one complementary embodiment of the invention, the master device is furthermore suitable for transmitting the result of the evaluation of the severity of the lightning strike undergone by the airplane to an avionic system of the airplane.

Advantageously, interfacing the system with the avionic system of the airplane allows the result of the evaluation of the severity of the lightning strike to be presented directly to the crew of the airplane. There is thus no need to interrogate the system on the ground after each flight.

The invention also relates to a device that is what is called a "master" device, intended to be comprised in an on-board system for evaluating the severity of a lightning strike undergone by an airplane, the system comprising at least one device that is what is called a "slave" device, the master device being suitable for receiving from each slave device a portion of a continuous recording of a measured magnetic field, identifying a scenario vis-à-vis the bolt of lightning received by the airplane depending on the one or more received recording portions, finding a predetermined transfer function associated with the identified scenario for each slave device, each transfer function allowing a current injected into the airplane by the bolt of lightning to be determined from a measured magnetic field, determining, from the received recordings and the injected current, an evaluation of the severity of the lightning strike undergone by the airplane.

The invention also relates to a device that is what is called a "slave" device, intended to be comprised in an on-board system for evaluating the severity of a lightning strike undergone by an airplane, the system comprising at least one master device, the slave device being suitable for continuously recording a magnetic field measured by the magnetic-field sensor, detecting, depending on the measured magnetic field, a moment corresponding to a bolt of lightning, selecting a portion of the continuous recording, depending on the detected moment, transmitting the selected portion of the continuous recording to what is called a master device.

The invention also relates to a method for evaluating the severity of a lightning strike undergone by an airplane, the method being executed by what is called a master device installed in the interior of the airplane and connected to at least one device that is what is called slave device, each slave device comprising a magnetic-field sensor, the method comprising the steps of receiving from each slave device a portion of a recording corresponding to a magnetic field measured by the magnetic-field sensor of the slave device, identifying a scenario vis-à-vis the bolt of lightning received by the airplane depending on the one or more received recording portions, finding a predetermined transfer function associated with the identified scenario for each slave device, each transfer function allowing a current injected into the airplane by the bolt of lightning to be determined from a measured magnetic field, determining, from the received recordings portions and an estimated injected current, an evaluation of the severity of the lightning strike undergone by the airplane.

According to one complementary embodiment of the invention, the method comprises a subsequent step of transmitting the result of the evaluation to an avionic system of the airplane.

The invention also relates to a computer program, which may be stored on a medium and/or downloaded from a communications network, in order to be read by a processor. This computer program contains instructions for implementing all or some of the aforementioned steps, when the program is executed by the processor. The invention also relates to a data storage medium containing such a computer program.

BRIEF DESCRIPTION OF THE DRAWINGS

The aforementioned features of the invention, and others, will become more clearly apparent on reading the following description of one exemplary embodiment, the description being given with reference to the appended drawings, in which.

DETAILED DESCRIPTION OF THE PREFERRED EMBODIMENTS

In the following description, and by convention, the longitudinal axis of an airplane oriented positively in the direction of advance of the airplane will be called the X-axis (or roll-axis), the transverse axis of the airplane, which is horizontal when the airplane is on the ground, will be called the Y-axis (or pitch-axis) and the vertical axis of the airplane when the airplane is on the ground will be called the Z-axis (or yaw-axis). These three directions X, Y and Z are orthogonal to one another and form an orthonormal coordinate system having for an origin the center of gravity of the airplane.

Likewise, "point of entrance" of the lightning and "point of exit" of the lightning refer to the location on the fuselage of the airplane of the points of entrance and exit of the lightning striking the airplane. The current flowing from one point to the other when lightning strikes the airplane, i.e., during the lightning strike, is called the "injected current."

Likewise, in the following description, a simplification of a transfer function "TF(t)," allowing a magnetic field "H(t)" measured by a magnetic-field sensor to be related to an injected current "I(t)" injected during a bolt of lightning is used. Specifically, the relationship between H(t) and I(t) is normally:

$H(t)=TF(t)*I(t)$, where "t" corresponds to the time.

Or, in other words in frequency form:

$H(f)=TF(f)\times I(f)$, where "f" corresponds to the variable "frequency."

Measurements carried out have shown that the energy in the frequency plane of a bolt of lightning is mainly distributed over frequencies lower than 100 kHz and that for these frequencies (f<100 kHz) the transfer function Tf(f) is, to a first approximation, of constant value.

Therefore, in the rest of the description, the transfer function TF(t) will be considered to be a parameter that is independent of time "t" or frequency "f," i.e., a scalar TF. For a given magnetic-field sensor, or more precisely for a given magnetic-field sensor location, the value of the scalar TF however remains dependent on the scenario vis-à-vis the "entrance point—point of exit" of the lightning on the airplane.

Figure 1:
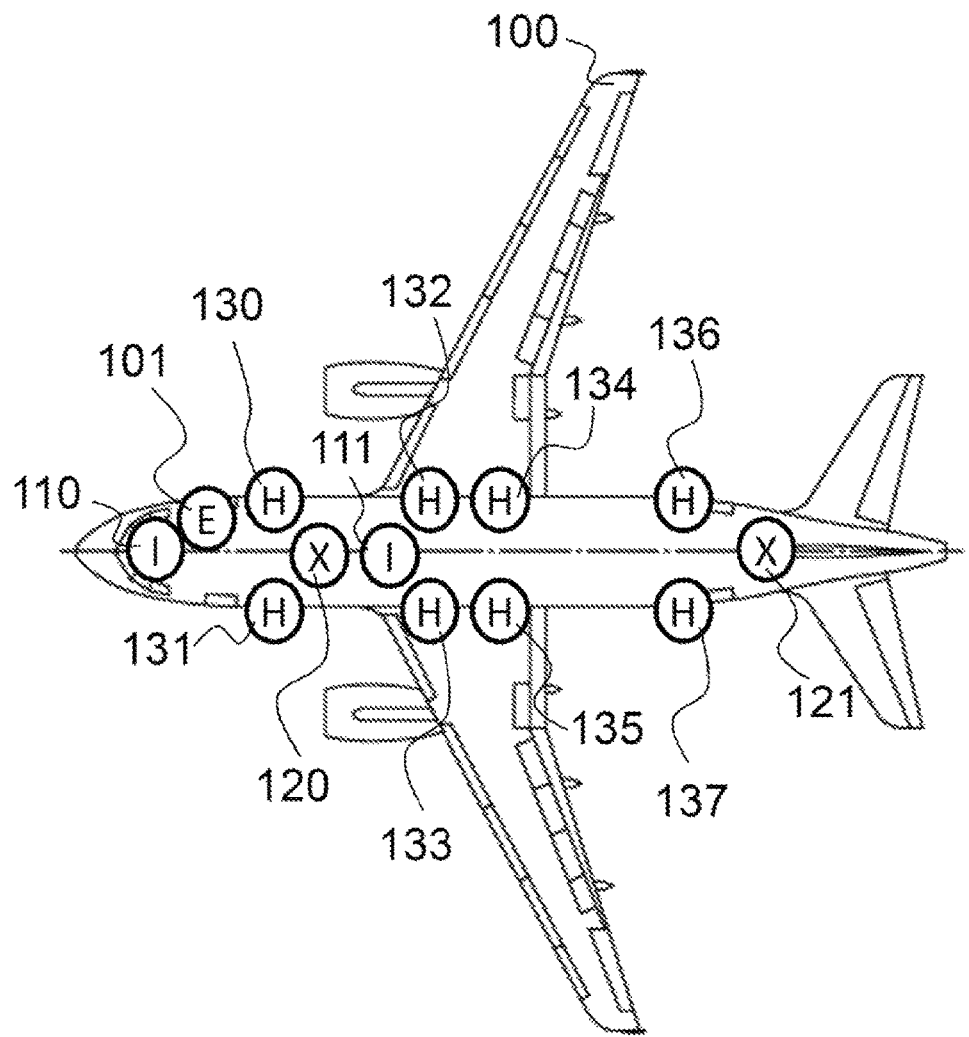
FIG. 1 schematically illustrates an on-board system for evaluating the severity of a lightning strike undergone by an airplane and in particular the damage caused by the lightning strike, such as developed in the ILDAS 2 project.
Figure 2:
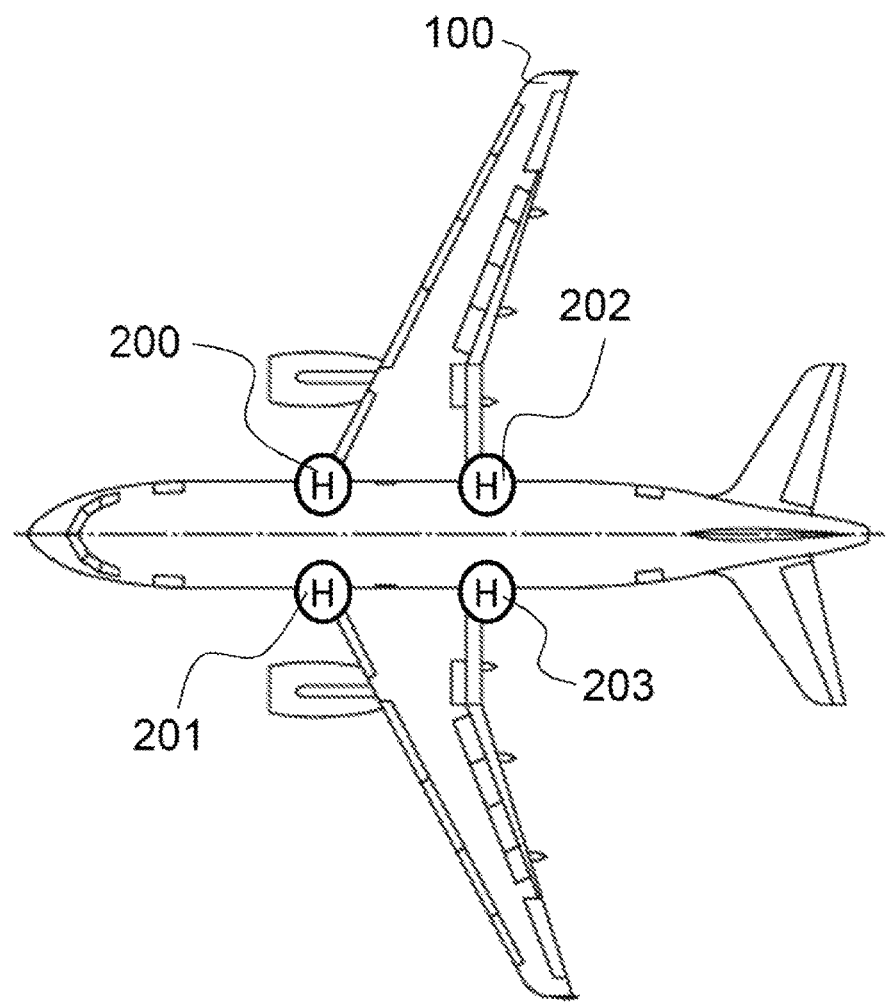
FIG. 2 illustrates an on-board system for evaluating the severity of a lightning strike undergone by an airplane, according to one embodiment of the invention.

FIG. 2 illustrates an on-board system for evaluating the severity of a lightning strike undergone by an airplane according to one embodiment of the invention. The on-board system is installed in the interior of the airplane 100 and comprises, according to the embodiment illustrated here, four devices 200, 201, 202 and 203. Installing the devices in the interior of the airplane 100 facilitates their installation and maintenance. These four devices comprise magnetic-field sensors, each magnetic-field sensor being installed on a porthole of the airplane 100. Two devices 200 and 201 are installed in front of the wings, the two other devices 202 and 203 being installed behind the wings. The devices are placed near portholes in order to make it possible to easily place the magnetic-field sensor of each device on a porthole. Preferably, the devices 200 and 201 are placed level with portholes that are located vertically in line with the leading edge of the wing of the airplane 100, or at least close to such a vertical alignment, in the front part of the airplane 100. Likewise, the devices 202 and 203 are preferably placed vertically in line with the trailing edge of the wing of the airplane 100, or at least close to this vertical alignment, in the back part of the airplane 100. For an airplane 100 comprising a plane of symmetry, the plane of symmetry being a vertical plane comprising the longitudinal axis X, the devices are preferably placed, pairwise, symmetrically with respect to this plane of symmetry. The positions of the devices 200 and 202, respectively, and 201 and 203, respectively, are thus symmetric with respect to the plane of symmetry of the airplane 100. This preferential arrangement of four devices for the system for evaluating the severity of a lightning strike undergone by an airplane is that which allows the best compromise to be obtained between a performance similar to the system comprising a multitude of sensors (i.e., the system illustrated in FIG. 1) and a limited system cost. In particular, this arrangement of four devices does not have the drawback of the two-device solution envisioned in the ILDAS 2 project, i.e., that almost all the scenarios vis-à-vis the "lightning entrance point—point of exit of the lightning" are covered by this solution in which these four devices are placed in these preferential positions.

The system illustrated in FIG. 2 comprises four devices: three devices that are what are called "slave" devices and one device that is what is called a "master" device. Since the device called the master device is intended to interface with the on-board avionics of the airplane 100, which are located in the front part of the airplane 100, it is preferable for this master device to be the device 200 or the device 201, in order to decrease the required length of cable. The four devices are, for example, connected via an Ethernet network. In the rest of the description, the device 200 is a master device and the devices 201, 202 and 203 are "slave" devices. Any other repartition is possible.

Figure 3:
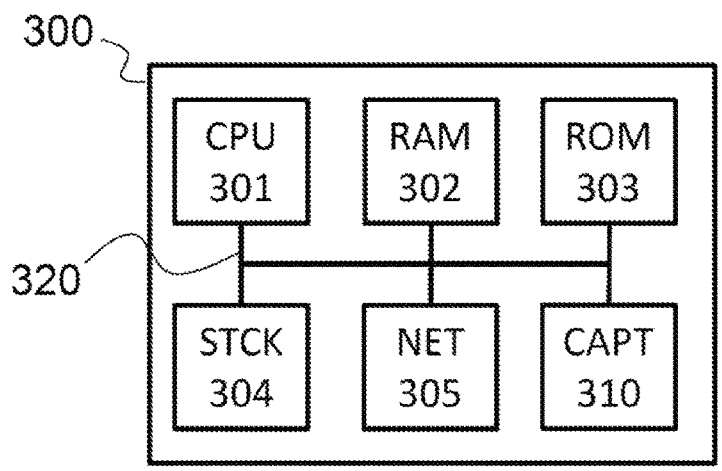
FIG. 3 schematically illustrates an exemplary hardware architecture of a device that is what is called a slave device, according to one embodiment of the invention.

FIG. 3 schematically illustrates an exemplary hardware architecture of a device 300 that is what is called a slave device according to one embodiment of the invention. FIG. 3 therefore illustrates the hardware architecture of the devices 201, 202 and 203 of FIG. 2.

The device 300, corresponding to what is called a slave device, includes, connected by a communication bus 320: a processor or CPU (Central Processing Unit) 301; a RAM (Random Access Memory) 302; a ROM (Read Only Memory) 303; an internal storage module STCK 304; a network module NET 305 and a magnetic-field sensor 310. The storage module STCK 304 may be a HDD (Hard Disk Drive) or SSD (Solid-State Drive), or a reader of an external storage medium, such as an SD (Secure Digital) card reader. The CPU processor 301 may record data to the RAM 302, to the ROM 303 or to the storage module STCK 304. The CPU processor 301 may likewise read data stored on the RAM 302, the ROM 303 or the storage module STCK 304. These data may correspond to configuration parameters, data generated by the magnetic-field sensor 310 or to information, for example, received in a message via the network module NET 305. The network module NET 305 is typically a network module that is compatible with an Ethernet technology. The magnetic-field sensor 310 is similar to that developed in the projects ILDAS 1 and ILDAS 2, and includes an antenna intended to be placed on a porthole of the airplane 100. The processor 301 is capable of executing instructions loaded into the RAM 302 or ROM 303, for example from the storage module STCK 304 or from a communications network via the network module NET 305. When the slave device 300 is on, the processor 301 is capable of reading instructions from the RAM 302, the ROM 303 or the storage module STCK 304 and of executing the instructions. These instructions form a computer program causing all or some of the methods and steps described below, in particular with reference to FIG. 5, to be implemented by the processor 301. Thus, all or some of the methods and steps described below may be implemented in software form by executing a set of instructions with a programmable machine such as a DSP (Digital Signal Processor) or a microcontroller. All or some of the methods and steps described here may also be implemented in hardware form by a machine or a dedicated component, such as an FPGA (Field-Programmable Gate Array) or an ASIC (Application-Specific Integrated Circuit).

Figure 4:
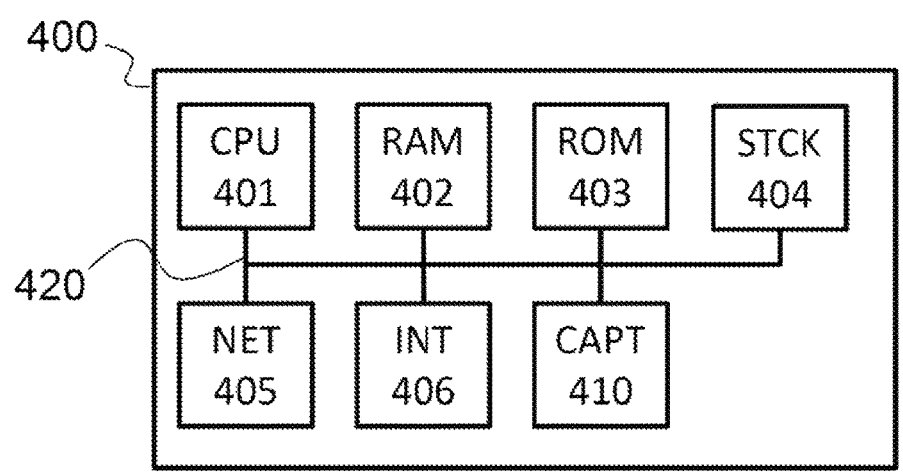
FIG. 4 schematically illustrates an exemplary hardware architecture of a device that is what is called a master device, according to one embodiment of the invention.

FIG. 4 schematically illustrates an exemplary hardware architecture of a device 400 that is what is called a master device according to one embodiment of the invention. FIG. 4 therefore illustrates the hardware architecture of the device 200 in FIG. 2.

The device 400, corresponding to a device that is what is called a master device, includes, connected by a communication bus 420: a processor or CPU (Central Processing Unit) 401; a RAM (Random Access Memory) 402; a ROM (Read Only Memory) 403; an internal storage module STCK 404; a network module NET 405; a magnetic-field sensor 410; and an interface module INT 406. The storage module STCK 404 may be a HDD (Hard Disk Drive) or SSD (Solid-State Drive), or a reader of an external storage medium, such as an SD (Secure Digital) card reader. The CPU processor 401 may record data to the RAM 402, to the ROM 403 or to the storage module STCK 404. The CPU processor 401 may likewise read data stored on the RAM 402, the ROM 403 or the storage module STCK 404. These data may correspond to configuration parameters, data generated by the magnetic-field sensor 410 or to information, for example received in a message via the network module NET 405. The network module NET 405 is typically a network module that is compatible with an Ethernet technology. The magnetic-field sensor 410 is similar to that developed in the projects ILDAS 1 and ILDAS 2, and includes an antenna intended to be placed on a porthole of the airplane 100. The interface module 406 allows the master device 400 to be interconnected with an avionic system of the airplane 100. The interface module 406 may comply with the "ARINC 429" (Aeronautical Radio INC) standard or the "CAN" (Controller Area Network) standard (defined in ISO standard 11898). The processor 401 is capable of executing instructions loaded into the RAM 402 or ROM 403, for example from the storage module STCK 404 or from a communications network via the network module NET 405. When the master device 400 is on, the processor 401 is capable of reading instructions from the RAM 402, the ROM 403 or the storage module STCK 404 and of executing the instructions. These instructions form a computer program causing all or some of the methods and steps described below, in particular with reference to FIG. 6, to be implemented by the processor 401. Thus, all or some of the methods and steps described below may be implemented in software form by executing a set of instructions with a programmable machine, such as a DSP (Digital Signal Processor) or a microcontroller. All or some of the methods and steps described here may also be implemented in hardware formed by a machine or a dedicated component, such as an FPGA (Field-Programmable Gate Array) or an ASIC (Application-Specific Integrated Circuit).

In other words, a master device 400 is a slave device 300 including different or supplementary elements. Thus, the processor 401 of the master device 400 may be more powerful than the processor 301 of the slave device 300, or the storage module STCK 404 of a larger capacity than the storage module STCK 304 of the slave device 300. The master device 400 moreover comprises an interface module 406 in order to allow it to be interconnected with an avionic system of the airplane 100. The master device 400 may therefore be considered to be a slave device 300 having supplementary functionalities, whether this be in terms of the processing power of the processor, its memory capacity, storage capacity or its ability to be interconnected with an avionic system of the airplane 100.

Figure 5:
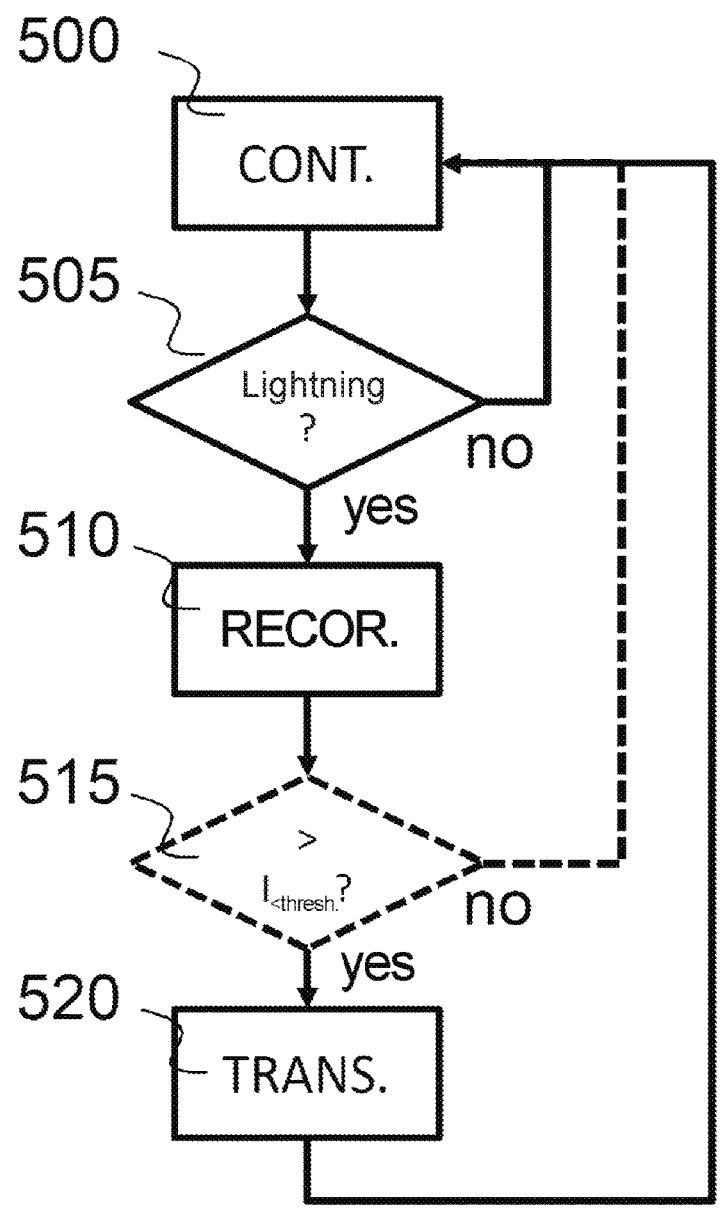
FIG. 5 schematically illustrates an exemplary method implemented by a device that is what is called a slave device, according to one embodiment of the invention.

FIG. 5 schematically illustrates an exemplary method implemented by a device 300 that is what is called a slave device according to one embodiment of the invention. This method is, for example, implemented by the device 201, 202 or 203 such as illustrated in FIG. 2. Following a phase of initialization of the slave device 400, which phase is not shown here, the slave device 300 starts a step of continuously recording a signal, or data, generated by the magnetic-field sensor 310. This signal therefore represents a magnetic field "H(t)" measured by the magnetic-field sensor 310. This signal is continuously recorded, for example in the RAM 302 or in the storage module STCK 304. By continuous recording, or loop recording, what must be understood is that the slave device 300 records the signal in a predetermined space of the RAM 302 or of the storage module STCK 304 and that when this space is filled, the recording starts again at the beginning, thus erasing the data corresponding to the signal recorded beforehand and replacing them with new data. The continuous recording for example allows a predetermined duration "T," called the "buffer" duration, for example one second (T=1 second), of the signal to be permanently held in memory, corresponding to the signal during the latter predetermined duration that has just passed. The recording made by the slave device 300 is timestamped, the timestamp being associated with the recording continuously. Possibly, the four devices 200, 201, 202 and 203 implement a method for synchronizing the timestamp, the master device 200 possibly acting as a reference clock.

In the step 505, the slave device 300 determines whether a bolt of lightning has struck the airplane 100. More precisely, in step 505, the slave device 300 detects a moment "Td" corresponding to a predetermined variation in or value of the signal generated by the magnetic-field sensor 310. This moment, for example, corresponds to the moment at which an absolute value of the magnetic field measured by the magnetic-field sensor 310 exceeds a predetermined threshold.

In a step 510, the slave device 300 saves some of the continuous recording, and does so depending on the moment Td determined beforehand. The objective is to obtain a portion of the continuous recording that comprises both a portion of the recording preceding the moment Td and a portion following the moment Td. To do this, following the determination of the moment Td, the slave device 300 continues to continuously record for another predetermined duration "D" (with D<T). At the end of the duration D, the slave device 300 saves the buffer duration T into memory, for example by copying the buffer recorded in the RAM 302 to the storage module 304. Thus, the slave device 300 saves a recording corresponding to a duration "D" after the moment Td and a duration "T–D" before the moment Td. Depending on the embodiment of the invention, the slave device 300 selects all or some of this saved recording. It is advantageous to select the entirety of the recording while minimizing the amount of memory required for the continuous recording in order to decrease the cost of the slave device 300. In contrast, if the step 505 of determining or detecting a bolt of lightning requires a significant amount of processing time, increasing the size of the memory in which the continuous recording is stored makes it possible to travel back in time and select an older portion of the recording.

Each slave device 201, 202 and 203 is intended to transmit the recordings made in step 510 to the master device 200, in order that the latter have at its disposal the signals generated by the various magnetic-field sensors so that it can evaluate as best as possible the severity of a lightning strike undergone by the airplane, and, in particular, any damage caused by the lightning. However, in order to decrease the workload of the master device 200 and to decrease the transmission of data from each slave device to the master device 200, an optional validating step 515 may be carried out by each slave device 201, 202 and 203 in order to determine whether or not the recording made in step 510 must be transmitted to the master device 200.

In the optional step 515, the slave device 300 determines the peak level of the magnetic field recorded in step 510, i.e., its maximum value. If this peak value is lower than a predetermined threshold "Hmin," then the recording is deleted and the slave device 300 returns to step 500. If the peak value is higher than the predetermined threshold, then, in a step 520, the slave device transmits to the master device 400, depending on the embodiment of the invention, either all or only a selected portion of the recording. According to the embodiment, a portion of the recording is selected by the slave device 300 in order to preserve only a predetermined portion of the recording, for example that portion of the recording which is centered on the peak value of the magnetic field. In other words, the slave device 300 sends a message to the master device 400, the message comprising all or a selected portion of the continuous recording. The timestamp associated with the recording is preserved.

Once the recording has been transmitted to the master device 200, the slave device 300 returns to step 500.

In other words, the slave device 300 continuously records a magnetic field measured by a magnetic-field sensor, and transmits to the master device 200 all or a selected portion of the recording corresponding to the magnetic field recorded when a bolt of lightning is detected.

Figure 6:
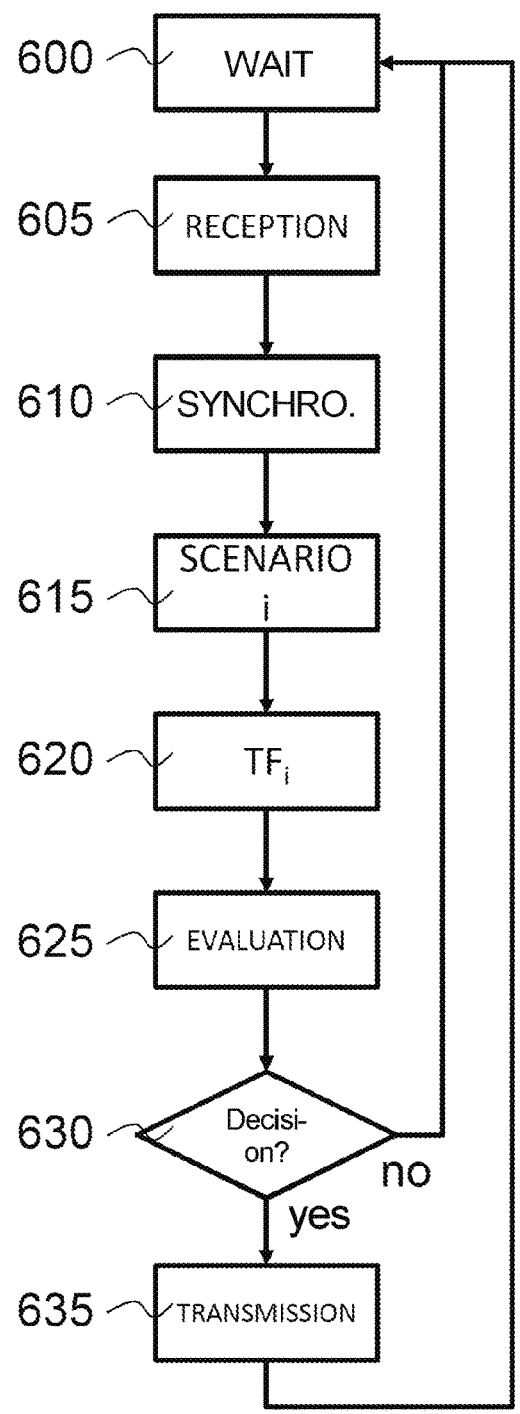
FIG. 6 schematically illustrates an exemplary method implemented by a device that is what is called a master device, according to one embodiment of the invention.

FIG. 6 schematically illustrates an exemplary method implemented by a device 200, 400 that is what is called a master device according to one embodiment of the invention. The method described below is carried out by the master device 200, 400 in addition and in parallel to the steps of the method described in FIG. 5 (with the exception of step 520, unless it is to be believed that the master device 400 transmits to itself a selected portion of the continuous recording). In other words, the master device 200, 400 carries out the steps illustrated in FIG. 5 identically to a slave device. The master device 200, 400 behaves just like a slave device as regards the steps of capturing a recording corresponding to the measurement of a magnetic field by the magnetic-field sensor 410 during a bolt of lightning.

In a step 600, the master device 400 is waiting for a message to arrive from a slave device 300, such as the slave device 201, 202 or 203.

In a step 605, the master device 400 receives a message from one of the slave devices 201, 202 or 203 comprising all or a selected portion of a continuous recording made by the slave device and records all or the selected portion of the continuous recording in the RAM 402 or the storage module STCK 404, possibly in association with an identifier of the slave device. This step 605 also corresponds for the master device 400 to the step 520 carried out by the same master device 400. In other words, when the master device 400 has selected all or a portion of the continuous recording obtained from its magnetic-field sensor 410, the master device 400 records all or the portion of the recording in the RAM 402 or the storage module STCK 404 in step 605.

In a step 610, the master device 400 synchronizes the various received recordings depending on the timestamp of each recording in order to verify that the received recordings correspond to the same event, i.e., to the same bolt of lightning received by the airplane. Depending on the embodiment, this synchronizing step 610 is carried out by the master device 400 only in the presence of a minimum number of recordings, which are either received from a slave device, or obtained from the magnetic-field sensor 410 of the master device 400. Preferably, step 610 is carried out only in the presence of four recordings, i.e., when each of the three slave devices 201, 202 and 203 has sent all or the selected portion of a continuous recording corresponding to a given bolt of lightning received by the airplane, at the same time as the master device 400 has also recorded all or a selected portion of a recording corresponding to a given bolt of lightning. The master device 400 may consider that received recordings with closely-spaced timestamps correspond to the same bolt of lightning in order to make allowance for possible time shifts between the received recordings.

In a step 615, the master device 400 determines a scenario vis-à-vis the bolt of lightning received by the airplane. By scenario, what is meant is the "point of entrance—point of exit" of the lightning on the airplane. Various points of entrance (or of exit) are possible on the airplane 100, the most common being:
the nose of the airplane,
the tail of the airplane,
the end of the right wing of the airplane, and,
the end of the left wing of the airplane.

Taking into account the four possible points of entrance or exit therefore makes it possible to distinguish between sixteen (16) possible scenarios. To distinguish between these various scenarios, the master device 400 identifies the sign (or the polarity) of the magnetic field measured for each received recording; sixteen possibilities once more being possible. The master device 400 thus finds in a predetermined matrix, for example recorded in the storage module STCK 404, the scenario corresponding to the identified combination of polarities of the received recordings (including the recording made by the master device 400).

In a step 620, the master device 400 finds a scalar TF associated with each of the four devices 200, 201, 202 and 203. Specifically, for each device 200, 201, 202 and 203, a value of the scalar TF is associated with each identified scenario. In other words, the identification of the scenario vis-à-vis the "point of entrance—point of exit" of the lightning on the airplane 100 allows the master device 400 to find a scalar TF for each of the devices 200, 201, 202 and 203. The matrix of scenarios, which is dependent on the polarity of the magnetic fields measured by each of the four devices 200, 201, 202 and 203, and the scalar TF associated with each of the devices for each scenario is predetermined for each type of airplane. A calibration phase is thus required to install the system in a new type of airplane. From a measured magnetic field and a scalar TF associated with the scenario/device, the master device 400 may determine an evaluation of a current injected by the bolt of lightning for each device 200, 201, 202 and 203. The master device 400 may determine from the four values of determined injected current an average injected current, and a standard deviation. The master device 400 also determines an action integral corresponding to the integral of the square of the value of the average current injected during the observation duration, i.e., the duration T (or the duration of the selected portion of the recording). This action integral is therefore proportional to the energy of the bolt of lightning received by the airplane.

In a step 625, the master device 400 proceeds to evaluate the bolt of lightning received by the airplane 100 depending on the collected data, i.e.:
the recordings (complete or partial) corresponding to the various measurements of the magnetic field,
the identified scenario,
the average injected current,
the standard deviation,
the action integral.

Depending on these data, and following a calibration phase carried out for each type of airplane 100, the master device 400 may deduce therefrom three options:
(a) high probability of damage caused to the airplane by the bolt of lightning,
(b) low probability of damage caused to the airplane by the bolt of lightning,
(c) uncertain.

The "high" probability and "low" probability criteria may be determined in the phase of calibration of the system for a given type of airplane depending on experimental results.

In a step 630, the master device 400 determines what decision vis-à-vis evaluation of the severity of the lightning strike undergone by the aircraft, and therefore of any damage, must be transmitted to an avionic system of the airplane 100.

According to one preferred embodiment, the master device 400 transmits, in a step 635, an instruction requesting inspection of the airplane following the bolt of lightning for options (e) and (c), i.e., in the cases where the master device 400 has determined either (a) that damage is likely, or (c) that it is uncertain.

The transmission to the avionic system of the airplane 100 is achieved by way of an interface module INT 406 complying with the standard used by this avionic system, for example the ARINC 429 or CAN standard.

In any case, the final decision as to whether to inspect the airplane or not is made by the captain of the airplane 100. The system described in the present document is intended to help the captain make a decision as to whether to request inspection of the airplane when the severity of the lightning strike means that damage is probable.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. An on-board system for evaluating the severity of a lightning strike undergone by an airplane, configured to be installed in the interior of the airplane, the system comprising:
   a master device, and,
   at least one slave device, each slave device comprising a processor, a memory, and a magnetic-field sensor placed on a porthole of the airplane, and being configured for:
      continuously recording a magnetic field measured by the magnetic-field sensor,
      determining whether lighting has struck the aircraft by detecting, depending on the measured magnetic field, a moment corresponding to a lightning strike,
      selecting a portion of the continuous recording, depending on the detected moment, corresponding to the lightning strike, and
      transmitting only the selected portion of the continuous recording to the master device,
   the master device being configured for:
      receiving from each slave device the portion of the continuous recording of the measured magnetic field,
      identifying a scenario vis-à-vis the bolt of lightning received by the airplane depending on the one or more received recording portions,
      finding a predetermined transfer function associated with the identified scenario for each slave device, each transfer function allowing a current injected into the airplane by the bolt of lightning to be determined from a measured magnetic field, and
      determining, from the received recordings and the injected current, an evaluation of the severity of the lightning strike undergone by the aircraft.

2. The system as claimed in claim 1, the master device comprising a magnetic-field sensor placed on a porthole of the airplane and being configured for integrating the functionalities of a slave device.

3. The system as claimed in claim 2, the system being located on board an airplane having a plane of symmetry, the system comprising one master device and three slave devices, the devices being placed pairwise symmetrically with respect to the plane of symmetry, the magnetic-field sensors of one pair of devices being installed on portholes in front of wings of the airplane and the magnetic-field sensors of the other pair of devices being installed on portholes behind the wings of the airplane.

4. The system as claimed in claim 3, the airplane having wings, the sensors of the four devices being installed on a pair of portholes located vertically in line with a leading-edge of the wings and on a pair of portholes located vertically in line with a trailing edge of the wings, the portholes of each pair of portholes being placed symmetrically with respect to the plane of symmetry.

5. The system as claimed in claim 1, the master device furthermore being suitable for transmitting a result of the evaluation of the severity of the lightning strike undergone by the airplane to an avionic system of the airplane.

6. A slave device, configured to be comprised in an on-board system for evaluating the severity of a lightning strike undergone by an airplane, the system comprising at least one master device, the slave comprising:
   a processor, a memory, and a magnetic-field sensor placed on a porthole of the airplane, and the slave device being configured for:
      continuously recording a magnetic field measured by the magnetic-field sensor,
      determining whether lightning has struck the aircraft by detecting, depending on the measured magnetic field, a moment corresponding to a bolt of lightning,
      selecting a portion of the continuous recording, depending on the detected moment, and
      transmitting only the selected portion of the continuous recording to a master device.

7. A method for evaluating the severity of a lightning strike undergone by an airplane, the method being executed by a master device installed in an interior of the airplane and connected to at least one slave device, each slave device comprising a processor, a memory, and a magnetic-field sensor, the method comprising the steps of:
   receiving from each slave device only a portion of a recording corresponding to a magnetic field measured by the magnetic-field sensor of the slave device corresponding to the lightning strike,
   identifying a scenario vis-à-vis the bolt of lightning received by the airplane depending on the one or more received recording portions,
   finding a predetermined transfer function associated with the identified scenario for each slave device, each transfer function allowing a current injected into the airplane by the bolt of lightning to be determined from a measured magnetic field, and determining, from the received recordings portions and an estimated injected current, an evaluation of the severity of the lightning strike undergone by the airplane.

8. The method as claimed in claim 7, comprising a subsequent step of transmitting a result of the evaluation to an avionic system of the airplane.

9. A non-transitory computer readable medium storing instructions executed by a processor to evaluate the severity of a lightning strike undergone by an airplane as claimed in claim 7.

* * * * *